US012575300B2

(12) United States Patent
Zhang et al.

(10) Patent No.: US 12,575,300 B2
(45) Date of Patent: Mar. 10, 2026

(54) DISPLAY PANEL, DISPLAY DEVICE, AND FABRICATING METHOD OF DISPLAY PANEL

(71) Applicants: Beijing BOE Technology Development Co., Ltd., Beijing (CN); BOE Technology Group Co., Ltd., Beijing (CN)

(72) Inventors: Yuanming Zhang, Beijing (CN); Haowei Wang, Beijing (CN); Yang Gao, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 387 days.

(21) Appl. No.: 18/017,225

(22) PCT Filed: Feb. 28, 2022

(86) PCT No.: PCT/CN2022/078221
§ 371 (c)(1),
(2) Date: Jan. 20, 2023

(87) PCT Pub. No.: WO2023/159550
PCT Pub. Date: Aug. 31, 2023

(65) Prior Publication Data
US 2024/0251643 A1 Jul. 25, 2024

(51) Int. Cl.
*H10K 59/50* (2023.01)
*G02F 1/1523* (2019.01)
(Continued)

(52) U.S. Cl.
CPC ......... *H10K 59/878* (2023.02); *G02F 1/1523* (2013.01); *G02F 1/155* (2013.01); *H10K 59/50* (2023.02)

(58) Field of Classification Search
CPC ......................... H10L 59/50; G02F 2001/1552
See application file for complete search history.

(56) References Cited

U.S. PATENT DOCUMENTS

2012/0326193 A1* 12/2012 Park .................. H10H 20/8515
257/E33.072
2014/0183492 A1 7/2014 Park et al.
(Continued)

FOREIGN PATENT DOCUMENTS

CN 103682160 A 3/2014
CN 105226077 A 1/2016
(Continued)

*Primary Examiner* — Eric K Ashbahian
(74) *Attorney, Agent, or Firm* — IPro, PLLC

(57) ABSTRACT

A display panel, a display device, and a fabricating method of a display panel. The display panel includes: a base substrate (1); a plurality of light-emitting devices (2) on a side of the base substrate (1); and additional members on a side of the light-emitting devices (2) away from the base substrate (1). The additional members includes light extraction structures (3) and electrochromic structures (4), where orthographic projections of the light extraction structures (3) on the base substrate (1) overlap orthographic projections of the light-emitting devices (2) on the base substrate (1), and the light extraction structures are configured to draw in light from the light-emitting devices (2); and orthographic projections of the electrochromic structures (4) on the base substrate (1) are located between orthographic projections of adjacent light-emitting devices (2) on the base substrate (1), and the electrochromic structures are configured such that the electrochromic structures (4) are in a transparent state when the light-emitting devices (2) emit light, and electrochromic structures (4) are in a shading state when the light-emitting devices (2) do not emit light.

25 Claims, 12 Drawing Sheets

(51) Int. Cl.
    *G02F 1/155*       (2006.01)
    *H10K 59/80*     (2023.01)

(56)               References Cited

U.S. PATENT DOCUMENTS

| | | | | |
|---|---|---|---|---|
| 2016/0334632 A1* | 11/2016 | Liao | .................... | G02F 1/13439 |
| 2019/0214440 A1* | 7/2019 | Lee | ........................ | G06F 3/0412 |
| 2019/0285959 A1* | 9/2019 | Guo | ........................ | G02F 1/1333 |
| 2019/0393286 A1* | 12/2019 | Ding | .................... | H10K 59/131 |
| 2020/0089046 A1* | 3/2020 | Li | ...................... | G02F 1/133345 |
| 2020/0105842 A1 | 4/2020 | Qi et al. | | |
| 2020/0279896 A1 | 9/2020 | Cao | | |
| 2021/0191546 A1* | 6/2021 | Zhang | .................. | G06F 3/0448 |
| 2022/0130924 A1* | 4/2022 | Takahashi | .............. | H04N 23/53 |
| 2022/0231200 A1* | 7/2022 | Kim | ........................ | H10K 59/38 |
| 2023/0028201 A1* | 1/2023 | Heber | .................. | G02F 1/1323 |
| 2023/0094306 A1* | 3/2023 | Park | ........................ | H10K 77/10 |
| | | | | 257/40 |

FOREIGN PATENT DOCUMENTS

| | | | |
|---|---|---|---|
| CN | 107466429 A | 12/2017 |
| CN | 107507854 A | 12/2017 |
| CN | 107644895 A | 1/2018 |
| CN | 108091678 A | 5/2018 |
| CN | 108987451 A | 12/2018 |
| CN | 109148544 A | 1/2019 |
| CN | 109326222 A | 2/2019 |
| CN | 210536818 U | 5/2020 |
| CN | 210723032 U | 6/2020 |
| CN | 113193151 A | 7/2021 |
| CN | 109873089 B | 9/2021 |
| CN | 216435908 U | 5/2022 |
| KR | 20210015205 A | 2/2021 |

* cited by examiner

1

DISPLAY PANEL, DISPLAY DEVICE, AND FABRICATING METHOD OF DISPLAY PANEL

CROSS REFERENCE TO RELATED APPLICATIONS

This application is a national phase entry under 35 U.S.C. § 371 of International Application No. PCT/CN2022/078221, filed on Feb. 28, 2022, the entire content of which is incorporated herein by reference.

FIELD

The disclosure relates to the field of semiconductor technology, and in particular, to a display panel, a display device, and a fabricating method of a display panel.

BACKGROUND

With the development of quantum dot technology, there is more research into the quantum dot electroluminescent light-emitting diodes, and the quantum efficiency is increasing continuously and has basically reached the level of industrialization. New processes and technologies are needed to achieve its industrialization.

SUMMARY

Embodiments of the disclosure provide a display panel, a display device, and a fabricating method of a display panel. The display panel includes: a base substrate, a plurality of light-emitting devices on a side of the base substrate, and additional members on a side of the light-emitting devices away from the base substrate. The additional members include light extraction structures and electrochromic structures. Orthographic projections of the light extraction structures on the base substrate overlap orthographic projections of the light-emitting devices on the base substrate, and the light extraction structures are configured to draw in light emergent from the light-emitting devices. Orthographic projections of the electrochromic structures on the base substrate are located between orthographic projections of adjacent light-emitting devices on the base substrate, and the electrochromic structures are configured to be in a transparent state when the light-emitting devices emit light, and to be in a shading state when the light-emitting devices do not emit light.

In a possible implementation, the orthographic projections of the light extraction structures on the base substrate cover the orthographic projections of the light-emitting devices on the base substrate.

In a possible implementation, the proportion of an orthographic projection area of the light extraction structures on the base substrate to an orthographic projection area of the electrochromic structures on the base substrate ranges from 0.7 to 1.6.

In a possible implementation, the orthographic projections of the light extraction structures on the base substrate cover the orthographic projections of the light-emitting devices on the base substrate and cover the orthographic projections of the electrochromic structures on the base substrate; and in areas where the orthographic projections of the light extraction structures overlap the orthographic projections of the electrochromic structures, the electrochromic structures are disposed on a side of the light extraction structures facing the base substrate.

In a possible implementation, the electrochromic structure includes: a first electrode, an electrochromic layer on a side of the first electrode away from the base substrate, and a second electrode on a side of the electrochromic layer away from the first electrode.

In a possible implementation, the material of the electrochromic layer includes one or more of: tungsten trioxide, molybdenum trioxide, polythiophenes and derivatives thereof, viologens, tetrathiafulvalenes, and metal phthalocyanine compounds.

In a possible implementation, the light extraction structure includes a plurality of light extraction film layers which are stacked successively, and the cross-sectional shape of each light extraction film layer in a direction perpendicular to the base substrate is rectangular.

In a possible implementation, the refractive indices of the light extraction film layers increase successively in a direction from the light-emitting device to the light extraction structure.

In a possible implementation, each light extraction film layer includes a first body, and a first dopant mixed in the first body; the refractive index of the first dopant is higher than that of the first body; and in the direction pointed from the light-emitting device to the light extraction structure, the proportion of the content of the first dopant in each light extraction film layer increases progressively.

In a possible implementation, the material of the first body includes silicon oxide, and the material of the first dopant includes boron nitride; or the material of the first body includes an organic matter or polymer, and the material of the first dopant includes titanium dioxide, zirconium dioxide, lead sulfide, or zinc sulfide.

In a possible implementation, in the direction from the light-emitting device to the light extraction structure, the cross-sectional areas of cross sections of the light extraction film layers in parallel with the base substrate decrease successively.

In a possible implementation, a difference between any two adjacent light extraction film layers in the same direction parallel to the base substrate is roughly the same.

In a possible implementation, each light extraction structure includes a lens structure with a circular dome.

In a possible implementation, the light extraction structure further includes a planarization structure between the light-emitting devices and the lens structure, the refractive index of the planarization structure being less than that of the lens structure.

In a possible implementation, an orthographic projection of the planarization structure on the base substrate and an orthographic projection of the lens structure on the base substrate overlap each other.

In a possible implementation, the display panel further includes dam structures for spacing different light-emitting devices; and the dam structure includes a first dam structure surrounding the light-emitting device.

In a possible implementation, the first dam structure is a shading structure of one film layer.

In a possible implementation, the first dam structure includes an electrochromic material, and the first dam structure is configured to switch between a transparent state and a non-transparent state depending on a voltage or current drive.

In a possible implementation, the first dam structure includes a first electrode, a second electrode, and an electrochromic material layer between the first electrode and the second electrode.

In a possible implementation, the material of the electrochromic material includes: tungsten trioxide, molybdenum trioxide, polythiophenes and derivatives thereof, viologens, tetrathiafulvalenes, or metal phthalocyanine compounds.

In a possible implementation, the light-emitting device includes: a first light-emitting electrode, a light-emitting layer on a side of the first light-emitting electrode away from the base substrate, and a second light-emitting electrode on a side of the light-emitting layer away from the first light-emitting electrode; and the first light-emitting electrode is used as the first electrode, and/or the second light-emitting electrode is used as the second electrode.

In a possible implementation, the dam structure further includes a second dam structure, which is located on a side of the first dam structure facing the light-emitting device, and the second dam structure is configured to reflect light emitted by the light-emitting device directing to the second dam structure to the light extraction structure.

In a possible implementation, the second dam structure includes: a reflective metal film or a metal dielectric reflective film.

In a possible implementation, the material of the reflective metal film includes silver or aluminum.

In a possible implementation, the metal dielectric reflective film includes a base film, and at least one dielectric layer on a side of the base film facing the light-emitting device; and the material of the base film includes: silicon monoxide, magnesium fluoride, silicon dioxide or aluminum trioxide.

In a possible implementation, the dam structure further includes a third dam structure on a side of the second dam structure facing the light-emitting device, and in a direction pointed from the base substrate to the light-emitting device, an opening formed by enclosure of the third dam structure in a direction parallel to the base substrate increases progressively.

In a possible implementation, the third dam structure includes a plurality of light guide film layers which are stacked successively; and in the direction from the base substrate to the light-emitting device, the refractive indices of the light guide film layers increase progressively.

In a possible implementation, each light guide film layer includes a second body, and a second dopant mixed in the second body; the refractive index of the second dopant is higher than that of the second body; and in the direction pointed from the base substrate to the light-emitting device, the proportion of the second dopant content in each light guide film layer increases progressively.

In a possible implementation, in the direction pointed from the base substrate to the light-emitting device, the cross-sectional areas of cross sections of the light guide film layers in parallel with the base substrate decrease progressively.

In a possible implementation, the thicknesses of the light guide film layers in the direction perpendicular to the base substrate are roughly the same.

In a possible implementation, the third dam structure is an inclined one-piece slope structure.

Embodiments of the disclosure further provide a display device, which includes the display panel provided in embodiments of the disclosure.

Embodiments of the disclosure further provide a fabricating method of the display panel provided in embodiments of the disclosure, including: providing the base substrate, forming a plurality of light-emitting devices on a side of the base substrate; and forming additional members including light extraction structures and electrochromic structures on a side of the light-emitting devices away from the base substrate. Orthographic projections of the light extraction structures on the base substrate overlap orthographic projections of the light-emitting devices on the base substrate, and orthographic projections of the electrochromic structures on the base substrate are located between orthographic projections of adjacent light-emitting devices on the base substrate.

In a possible implementation, each light extraction structure includes a plurality of light extraction film layers which are stacked successively; and forming light extraction structures on a side of the light-emitting devices away from the base substrate includes: forming a plurality of light extraction film layers by multiple evaporation steps, and controlling the area of an orthographic projection of a light extraction film layer formed by a subsequent evaporation step after a current evaporation step on the base substrate to be smaller than the area of an orthographic projection of a light extraction film layer formed by the current evaporation step on the base substrate.

In a possible implementation, forming a plurality of light extraction film layers by multiple evaporation steps includes: in areas where the light-emitting devices are located, forming a plurality of light extraction film layers, each including a first body and a first dopant, by multiple evaporation steps, and controlling the proportion of the first dopant in the light extraction film layer formed by the subsequent evaporation step to be greater than the proportion of the first dopant in the light extraction film layer formed by the current evaporation step.

In a possible implementation, each light extraction structure includes a lens structure with a circular dome; and forming additional members on a side of the light-emitting devices away from the base substrate includes: printing a second ink via a first inkjet printing process in areas where the light-emitting devices are located; and irradiating the second ink by ultraviolet light to form the lens structure.

In a possible implementation, the light extraction structure further includes a planarization structure between the light-emitting device and the lens structure; and before printing a second ink by a first inkjet printing process, forming additional members on a side of the light-emitting devices away from the base substrate further includes: printing a first ink via a second inkjet printing process; and drying the first ink by a drying device to volatilize a solvent in the first ink to form the planarization structure, a surface of which facing away from the light-emitting device is flat.

In a possible implementation, forming electrochromic structures on a side of the light-emitting devices away from the base substrate includes: forming a first electrode, an electrochromic layer, and a second electrode successively in areas where adjacent light-emitting devices are located on a side of the light-emitting devices away from the base substrate.

DETAILED DESCRIPTION

Figure 1:
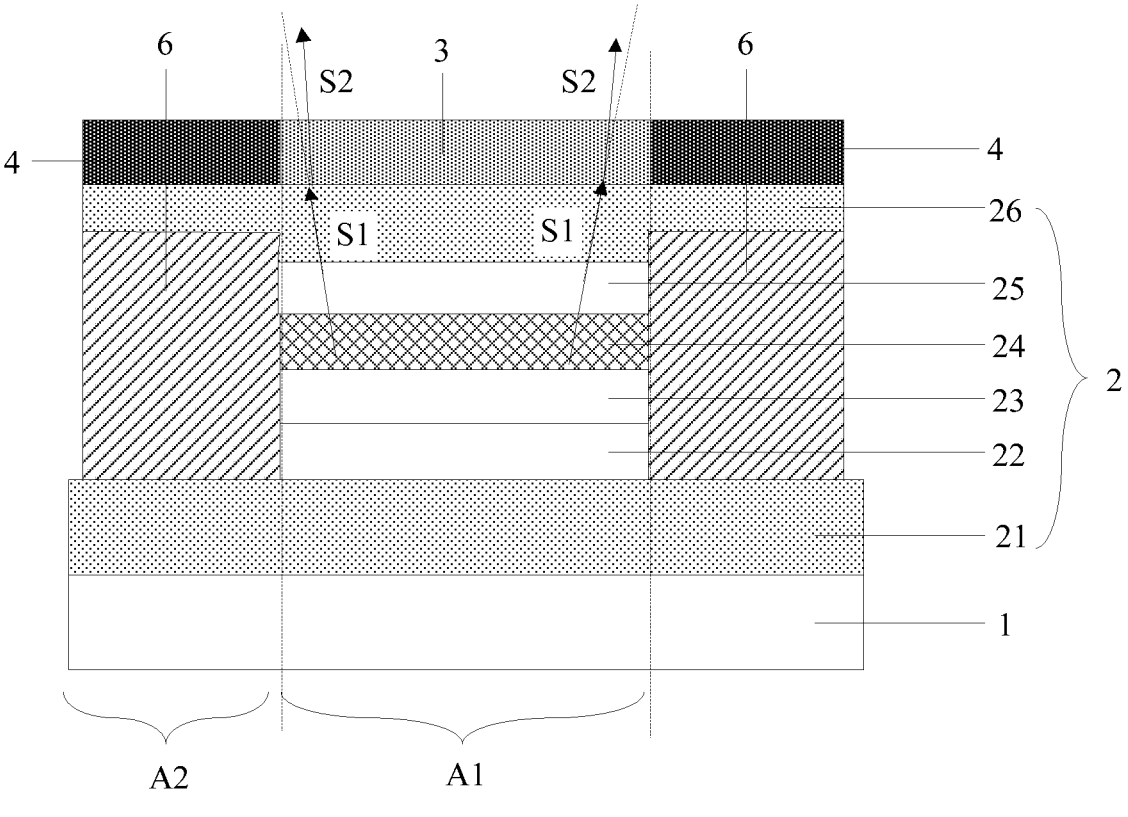
FIG. 1 is a first sectional view of a display panel provided in embodiments of the disclosure.

In order to make the objects, technical solutions, and advantages of embodiments of the disclosure more apparent, the technical solutions in embodiments of the disclosure will be described clearly and completely in conjunction with the drawings in embodiments of the disclosure. Obviously, the described embodiments are only a part but not all of embodiments of the disclosure. Based on the described embodiments of the disclosure, all other embodiments obtained by those of ordinary skill in the art without creative work shall fall into the protection scope of the disclosure.

Unless otherwise defined, technical or scientific terms used in the disclosure shall have ordinary meanings understood by those of ordinary skill in the art to which the disclosure pertains. The words "first", "second" and the like used in present disclosure do not indicate any order, quantity or importance, but are only used to distinguish different components. The word "comprise" or "include" or the like means that an element or item appearing before such a word covers listed elements or items appearing after the word and equivalents thereof, and does not exclude other elements or items. The word "connect" or "interconnect" or the like is not limited to physical or mechanical connections, but can include electrical connections, regardless of direct or indirect connections. The words "up", "down", "left", "right" and the like are only used to indicate a relative positional relationship. When the absolute position of a described object changes, the relative positional relationship may also change accordingly.

The expression "approximately" or "substantially the same", as used herein, includes a stated value and implies an acceptable range of deviation from a specific value as determined by one of ordinary skill in the art taking into account a discussed measurement and an error related to the measurement of a specific quantity (i.e., limitation of a measurement system). For example, the expression "roughly the same" may mean that the difference from the stated value is within the range of one or more standard deviations, or within the range of ±30%, ±20%, ±10%, or ±5%.

In the accompanying drawings, the thicknesses of layers, films, panels, areas, etc. are enlarged for clarity. Exemplary implementations are described herein with reference to transverse-sectional views as schematic diagrams of idealized implementations. In this way, deviations from the shapes of the figures as a result of, for example, manufacturing technologies and/or tolerances will be expected. Thus, implementations described herein should not be interpreted as being limited to the specific shapes of areas as shown herein, but include deviations in shape resulting from, for example, manufacturing. For example, areas illustrated or described as flat may typically have rough and/or non-linear features. In addition, illustrated sharp corners may be rounded. Thus, areas shown in the drawings are schematic in nature, and their shapes are not intended to be precise shapes of the illustrated areas and are not intended to limit the scope of the present claims.

To keep the following description of the embodiments of the disclosure clear and concise, detailed description of known functions and known components is omitted in the disclosure.

Figure 2:
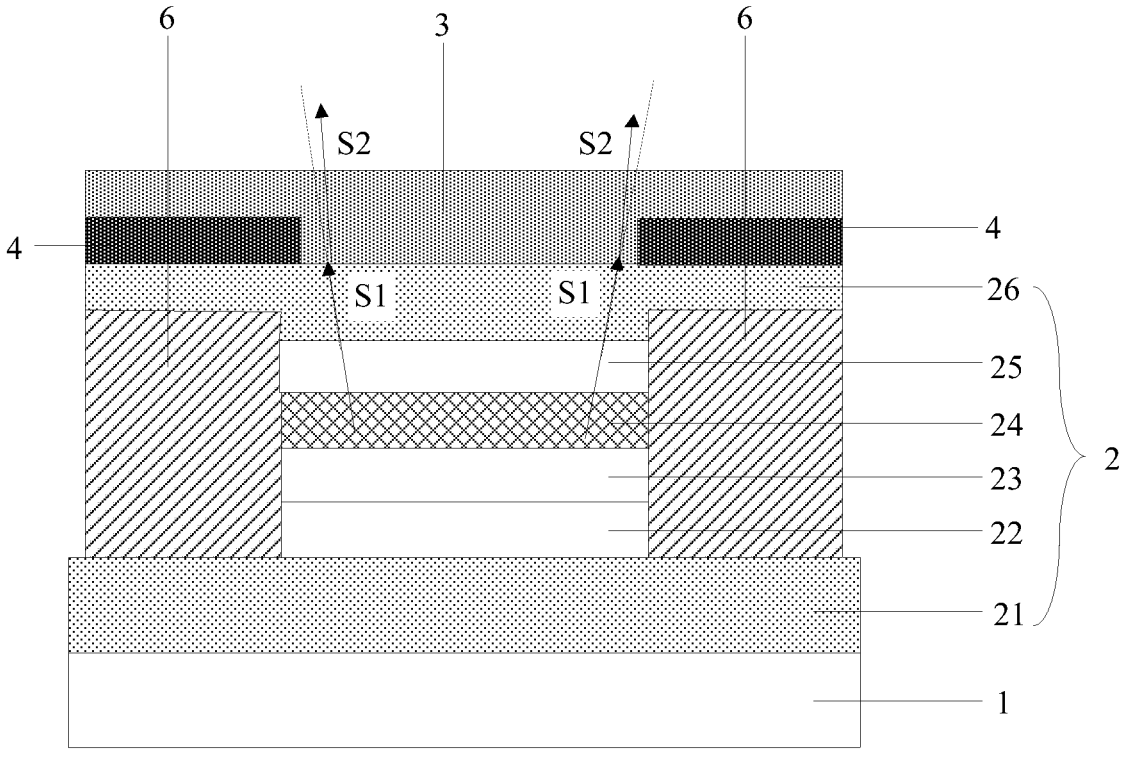
FIG. 2 is a second sectional view of a display panel provided in embodiments of the disclosure.

Referring to FIGS. 1 and 2, embodiments of the disclosure provide a display panel, including:

a base substrate 1;

a plurality of light-emitting devices 2, the plurality of light-emitting devices 2 being disposed on a side of the base substrate 1; and additional members disposed on a side of the light-emitting devices 2 away from the base substrate 1, the additional members including light extraction structures 3 and electrochromic structures 4, where orthographic projections of the light extraction structures 3 on the base substrate 1 overlap orthographic projections of the light-emitting devices 2 on the base substrate 1, and the light extraction structures are configured to make in light from the light-emitting devices 2 converge; and orthographic projections of the electrochromic structures 4 on the base substrate 1 are located between orthographic projections of adjacent light-emitting devices 2 on the base substrate 1, and the electrochromic structures are configured to be in a transparent state when the light-emitting devices emit light, i.e., when the display panel performs displaying, and to be in a shading state when the light-emitting devices do not emit light, i.e., when the display panel does not perform displaying.

In embodiments of the disclosure, additional members are further provided on a side of the light-emitting devices 2 away from the base substrate 1, the additional members including light extraction structures 3 and electrochromic structures 4, where the light extraction structures 3 can draw in light emergent from the light-emitting devices 2, thereby condensing the light emitted by the light-emitting devices 2, to improve the light extraction efficiency of the display panel. The electrochromic structures 4 arranged in areas where adjacent light-emitting devices 2 are located can be in a transparent state when the light-emitting devices emit light, i.e., when the display panel performs displaying, and in a shading state when the light-emitting devices do not emit light, i.e., when the display panel does not perform displaying, and thus can play a role similar to a circular polarizer to reduce the influence on the display panel when external ambient light enters the display panel and is reflected by the internal structure of the display panel, and compared with a traditional circular polarizer which filters all light such that the brightness of the display panel is reduced by about 50% and the power consumption of the display panel is increased, the electrochromic structures provided in embodiments of the disclosure can improve outgoing light brightness of the display panel and reduce the power consumption of the display panel while functioning to reduce the influence of external ambient light on the display panel like a polarizer.

Each light extraction structure 3 drawing in the light emergent from the light-emitting device 2, in conjunction with FIG. 1, can be considered as that a first light ray S1 emergent from the light-emitting device 2 becomes a second light ray S2 after passing through the light extraction structure 3, where the second light ray S2 is deflected with respect to the first light S1 to a side where the center of the light-emitting device 2 is located, thereby achieving an effect of drawing in and condensing the light emergent from the light-emitting device 2. The second light ray S2 emergent from the light extraction structure 3 after the light emergent from the light-emitting device 2 is drawn in thereby can be in a direction perpendicular to of the base substrate 1, and can also be at an acute angle or an obtuse angle with respect to the base substrate 1, and as long as it can be deflected with respect to the first light ray S1 to the side where the center of the light-emitting devices 2 is located, the light emergent from the light-emitting devices 2 can be considered to be drawn in.

In a possible implementation, in conjunction with FIG. 1, the orthographic projections of the light extraction structures 3 on the base substrate 1 only cover the orthographic projections of the light-emitting devices 2 on the base substrate 1, i.e., the light extraction structures 3 are only provided in areas where the light-emitting devices 2 are located to draw in the light emergent from the light-emitting devices 2.

Each light-emitting device 2 can include a first light-emitting electrode 21, a light-emitting layer 24, and a second light-emitting electrode 26 which are disposed successively on the base substrate 1; the orthographic projection of the light-emitting device 2 on the base substrate 1 can be considered as an orthographic projection of the light-emitting layer 24, which mainly functions to emit light, on the base substrate 1. Specifically, the light-emitting device can be an upright structure, the first light-emitting electrode 21 can be an anode, the second light-emitting electrode 26 can be a cathode, and the light-emitting device can also include a hole injection layer 22 between the first light-emitting electrode 21 and the light-emitting layer 24, a hole transport layer 23 between the hole injection layer 22 and the light-emitting layer 24, and an electron transport layer 25 located between the light-emitting layer 24 and the second light-emitting electrode 26. Specifically, the light-emitting device 2 can also be other film layer structure, and the light-emitting device 2 can also be an inverted structure, and embodiments of the disclosure are not limited thereto. Specifically, the light-emitting device 2 in embodiments of the disclosure can be a quantum dot light-emitting device, and the material of the light-emitting layer 24 can specifically be quantum dots; the light-emitting device 2 can also be an organic light-emitting device, and the material of the light-emitting layer 24 can be an organic light-emitting material.

In a possible implementation, in conjunction with FIG. 1, the proportion of an orthographic projection area A1 of the light extraction structures 3 on the base substrate 1 to an orthographic projection area A2 of the electrochromic structures 4 on the base substrate 1 ranges from 0.7 to 1.6.

In a possible implementation, in conjunction with FIG. 2, the orthographic projections of the light extraction structures 3 on the base substrate 1 cover the orthographic projections of the light-emitting devices 2 on the base substrate 1 and cover the orthographic projections of the electrochromic structures 4 on the base substrate 1; and in areas where the orthographic projections of the light extraction structures 3 overlap the orthographic projections of the electrochromic structures 4, the electrochromic structures 4 are disposed on a side of the light extraction structures 3 facing the base substrate 1. That is, in specific implementation, the light extraction structures 3 can also be provided in areas other than areas where the light-emitting devices 2 are located. For example, the light extraction structures 3 are also provided in areas where the electrochromic structures 4 are located. In the areas where the orthographic projections of the light extraction structures 3 overlap the orthographic projections of the electrochromic structures 4, the electrochromic structures 4 are disposed below the light extraction structures 3, with respect to the light extraction structures 3.

Figure 3:
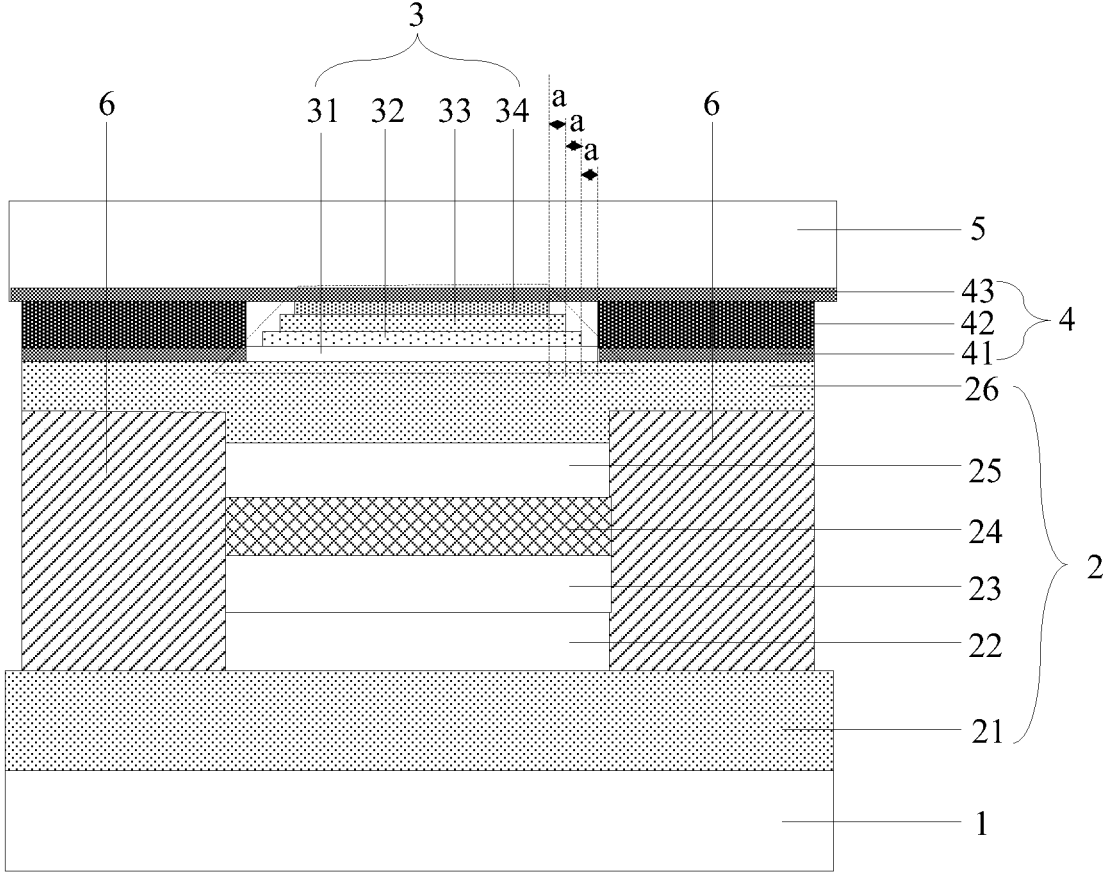
FIG. 3 is a third sectional view of a display panel provided in embodiments of the disclosure.
Figure 4:
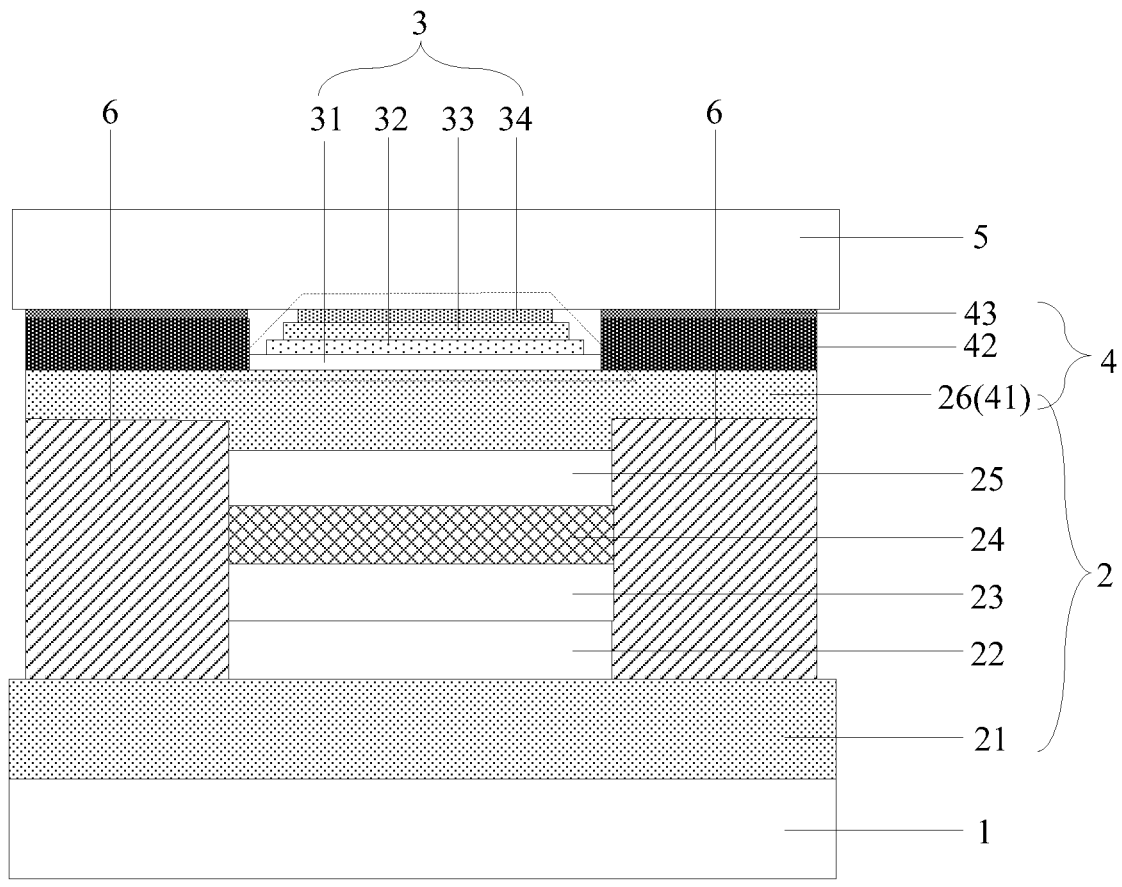
FIG. 4 is a fourth sectional view of a display panel provided in embodiments of the disclosure.

In a possible implementation, in conjunction with FIG. 3 or 4, each electrochromic structure 4 includes: a first electrode 41, an electrochromic layer 42 on a side of the first electrode 41 away from the base substrate 1, and a second electrode 43 on a side of the electrochromic layer 42 away from the first electrode 41.

Specifically, in conjunction with FIG. 3, the first electrodes 41 of the electrochromic structures 4 can be mutually independent structures, and the second electrodes 43 of the electrochromic structures 4 can be an one-piece structure; in conjunction with FIG. 4, the first electrodes 41 of the electrochromic structures 4 can be a one-piece structure, and the second electrodes 43 of the electrochromic structures 4 can be mutually independent structures, and specifically, the second electrodes 43 can be also used as the second light-emitting electrodes 26 of the light-emitting devices 2.

In specific fabrication of the electrochromic structures 4, after formation of the light-emitting devices 2, the electrochromic structures 4 can be fabricated above the light-emitting devices 2 on the base substrate 1. In another possible implementation, the display panel can also include a packaging structure 5. The packaging structure 5 can be a packaging cover plate, such as a glass cover plate. The electrochromic structures 4 can also be fabricated on the packaging cover plate, and then the packaging cover fabricated with electrochromic structures 4 can be laid on top of the base substrate 1 fabricated with the light-emitting devices 2, in such a manner that a side of the former having the electrochromic structures 4 faces the latter, to form the display panel shown in embodiments of the disclosure. Specifically, the packaging structure 5 can also be a thin film packaging layer, which can include a first inorganic packaging layer, an organic packaging layer and a second inorganic packaging layer which are stacked successively.

In a possible implementation, the width of the electrochromic layer 42 in a direction parallel with the base substrate 1 is 5 μm to 25 μm.

In a possible implementation, the material of the electrochromic layer 42 includes one or more of: tungsten trioxide/molybdenum trioxide, polythiophenes and derivatives thereof, viologens, tetrathiafulvalenes, and metal phthalocyanine compounds.

In a possible implementation, in conjunction with FIG. 3, each light extraction structure 3 includes a plurality of light extraction film layers which are stacked successively. For example, the light extraction structure 3 can include, successively disposed on a side of the light-emitting device 2 away from the base substrate 1: a first sub-light extraction film layer 31, a second sub-light extraction film layer 32, a third sub-light extraction film layer 33, and a fourth sub-light extraction film layer 34. The cross-sectional shape of each light extraction film layer in a direction perpendicular to the base substrate 1 is rectangular. In specific implementation, the light extraction film layers can be evaporated successively to form the light extraction structure 3 including the plurality of light extraction film layers. Specifically, the light extraction film layers can be formed by chemical vapor deposition.

In a possible implementation, in conjunction with FIG. 3, the refractive indices of the light extraction film layers increase successively in a direction from the light-emitting device 2 to the light extraction structure 3. That is, the refractive index of the first sub-light extraction film layer 31 is less than the refractive index of the second sub-light extraction film layer 32, the refractive index of the second sub-light extraction film layer 32 is less than the refractive index of the third sub-light extraction film layer 33, and the refractive index of the third sub-light extraction film layer 33 is less than the refractive index of the fourth sub-light extraction film layer 34. In embodiments of the disclosure, in the direction from the light-emitting device 2 to the light extraction structure 3, the refractive indices of the light extraction film layers increase successively, and thus the effect of drawing in the light emergent from the light-emitting device 2 can be achieved.

In a possible implementation, in conjunction with FIG. 3, each light extraction film layer includes a first body, and a first dopant mixed in the first body; the refractive index of the first dopant is higher than that of the first body; and in the direction from the light-emitting device to the light extraction structure, the proportion of the content of the first dopant in each light extraction film layer increases progressively. Specifically, when the light extraction film layers are formed by evaporation, the contents of the first body and the first dopant can be controlled to allow the refractive indices of the light extraction film layers to increase successively.

In a possible implementation, the material of the first body includes silicon oxide, and the material of the first dopant includes boron nitride. Specifically, when the light extraction film layers are fabricated by chemical vapor deposition, the amounts of boron nitride and silicon oxide are controlled to achieve a higher content of boron nitride doped in an upper layer, such that the refractive index in the upper layer is higher than that in a lower layer; or the material of the first body includes an organic matter or polymer, and the material of the first dopant includes titanium dioxide, zirconium dioxide, lead sulfide, or zinc sulfide, and specifically, an inorganic material with a high refractive index such as titanium dioxide ($TiO2$), zirconium dioxide ($ZrO2$), lead sulfide ($PbS$) or zinc sulfide ($ZnS$) can be doped at the nanoscale on an organic or polymeric substrate material, and the ratio between the inorganic and organic materials is adjusted to prepare the light extraction film layers.

In a possible implementation, in conjunction with FIG. 3, in the direction from the light-emitting device 2 to the light extraction structure 3, the cross-sectional areas of cross sections of the light extraction film layers in parallel with the base substrate 1 decrease successively. In this way, the light extraction structure 3 formed by the light extraction film layers can be structurally formed as a lens-like structure, and further achieves the effect of drawing in and condensing the light emergent from the light-emitting devices 2.

In a possible implementation, in conjunction with FIG. 3, a difference a between any two adjacent light extraction film layers in the same direction parallel to the base substrate 1 is substantially the same. Specifically, due to actual process errors, it is very difficult to require the difference a to be exactly the same. Specifically, the difference a between any two adjacent light extraction film layers in the same direction parallel to the base substrate 1 being substantially the same can be understood as that a deviation from the difference a between any two adjacent light extraction film layers in the same direction parallel to the base substrate 1 can be less than or equal to 0.5 µm.

The lengths and widths of the first sub-light extraction film layer 31, the second sub-light extraction film layer 32, the third sub-light extraction film layer 33, and the fourth sub-light extraction film layer 34 in two perpendicular directions on a plane parallel to the base substrate 1 can be correlated with size dimensions of the corresponding light-emitting device 2. If the light-emitting device 2 has a length of X µm and a width of Y µm, the lengths and widths of the first sub-light extraction film layer 31, the second sub-light extraction film layer 32, the third sub-light extraction layer 33, and the fourth sub-light extraction layer 34 can be ((X+5)µm to (X+10)µm, (Y+5)µm to (Y+10)µm), ((X+4)µm to (X+9)µm, (Y+4)µm to Y+9 µm), ((X+3)µm to (X+8)µm, (Y+3)µm to (Y+8)µm), ((X+2)µm to (X+7)µm, (Y+2)µm to (Y+7)µm), respectively.

The thicknesses of the first sub-light extraction film layer 31, the second sub-light extraction film layer 32, the third sub-light extraction film layer 33, and the fourth sub-light extraction film layer 34 in parallel with the base substrate 1 can be roughly the same, can be 0.4 µm to 0.6 µm, and more specifically, can be 0.3 µm to 0.5 µm. Specifically, due to actual process errors, it is difficult to strictly require the thicknesses of the light extraction film layers to be exactly the same. In specific implementation, the thicknesses of the first sub-light extraction film layer 31, the second sub-light extraction film layer 32, the third sub-light extraction film layer 33, and the fourth sub-light extraction film layer 34 in parallel with the base substrate 1 being substantially the same can be understood as that the proportion of the difference between any two of them in the thickness of one of them is 0 to 20%.

Figure 5:
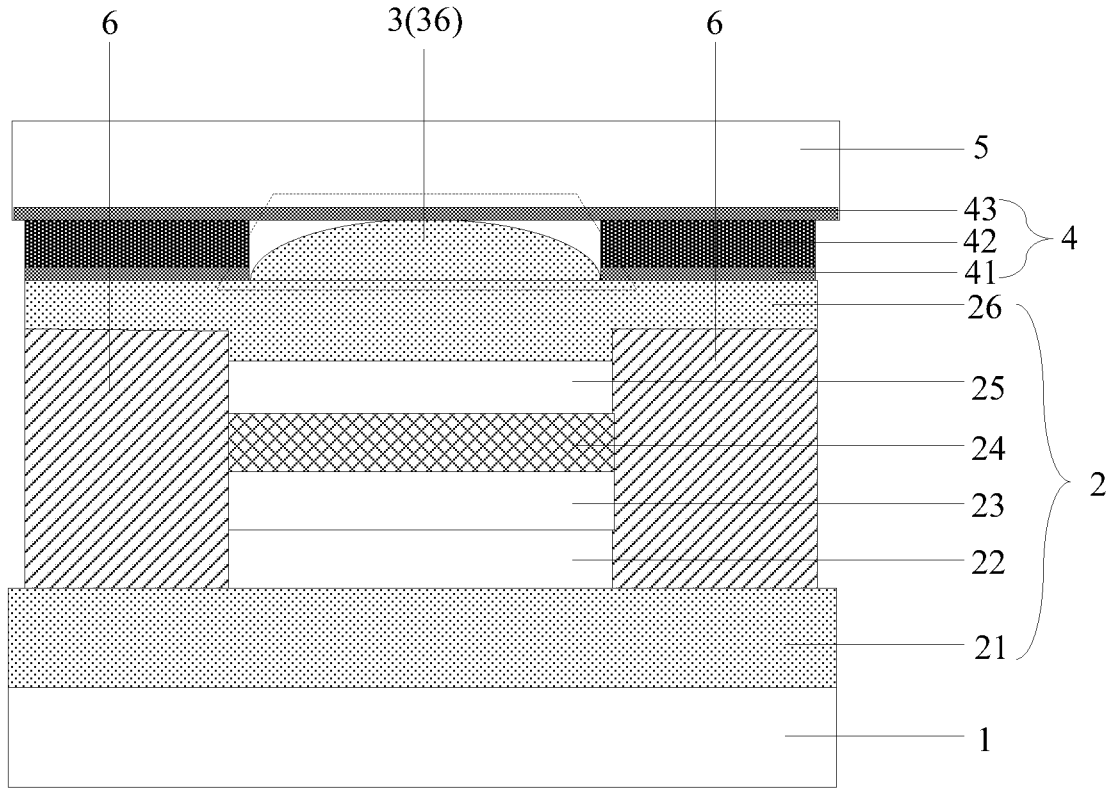
FIG. 5 is a fifth sectional view of a display panel provided in embodiments of the disclosure.

In a possible implementation, in conjunction with FIG. 5, each light extraction structure 3 includes a lens structure 36 with a circular dome. In embodiments of the disclosure, each light extraction structure 3 including a lens structure 36 with a circular dome can make the light emergent from the light-emitting device 2 converge.

In specific implementation, the lens structure 36 with a circular dome can be formed by printing a transparent photocurable ink, which functions to condense light after curing. Of course, in specific implementation, the lens structure 36 with a circular dome can also be formed in other ways, and embodiments of the disclosure are not limited thereto, but compared with other ways of forming the lens structure 36 with a circular dome, an inkjet printing process to form the lens structure 36 with a circular dome is more mature and convenient for fabrication.

Figure 6:
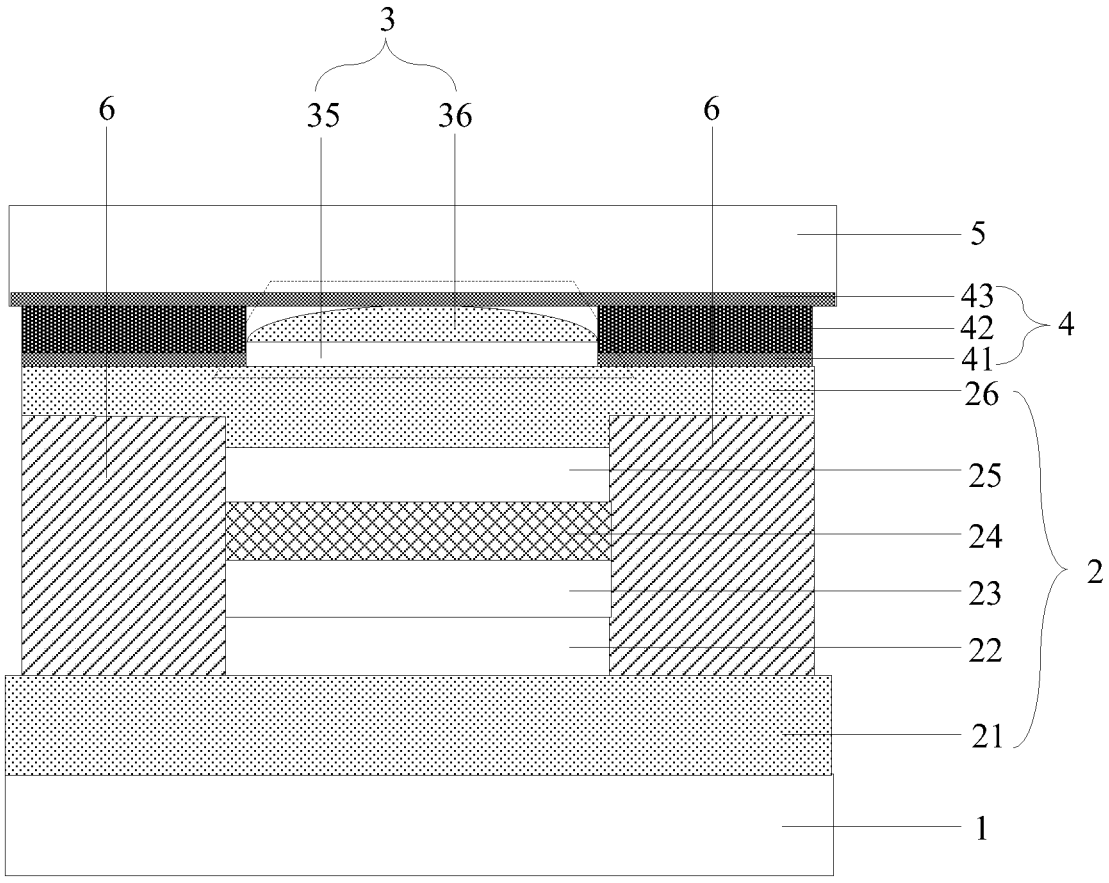
FIG. 6 is a sixth sectional view of a display panel provided in embodiments of the disclosure.

In a possible implementation, in conjunction with FIG. 6, the light extraction structure 3 further includes a planarization structure 35 between the light-emitting devices 2 and the lens structure 36, the refractive index of the planarization structure 35 being less than that of the lens structure 36. In specific implementation, the planarization structure 35 can be formed by an inkjet printing process. That is, ink printing can be carried out twice. A first ink is printed first, with the number of droplets of the first ink being set to 1 to 3, after which a solvent in the first ink can be dried by using a drying device to obtain a relatively flat film, and then a second ink is printed, which is a photocurable ink, the number of printing droplets of which is set to 1 to 10, and after printing is completed, irradiation with ultraviolet light (such as ultraviolet light of 365 nm) is carried out for 500 ms to 40 s so that the ink is cured to form the lens structure 3. The thickness of the planarization structure 35 formed after the first ink is dried is 0.01 µm to 0.1 µm, and the thickness of the second ink at a maximum position is 0.7 to 2 µm. A main function of the first ink is to enable a contact angle with the film layer underneath to be small. It facilitates spreading of the second ink to avoid that the second ink gathers only in part of the area where the light-emitting devices 2 are located. Specifically, the refractive index of the first ink is less than that of the second ink, the refractive index of the first ink can be 1.4 to 1.6, and the refractive index of the second ink can be 1.6 to 2.

In a possible implementation, in conjunction with FIG. 6, an orthographic projection of the planarization structure 35 on the base substrate 1 and an orthographic projection of the lens structure 36 on the base substrate 1 overlap each other.

Figure 7:
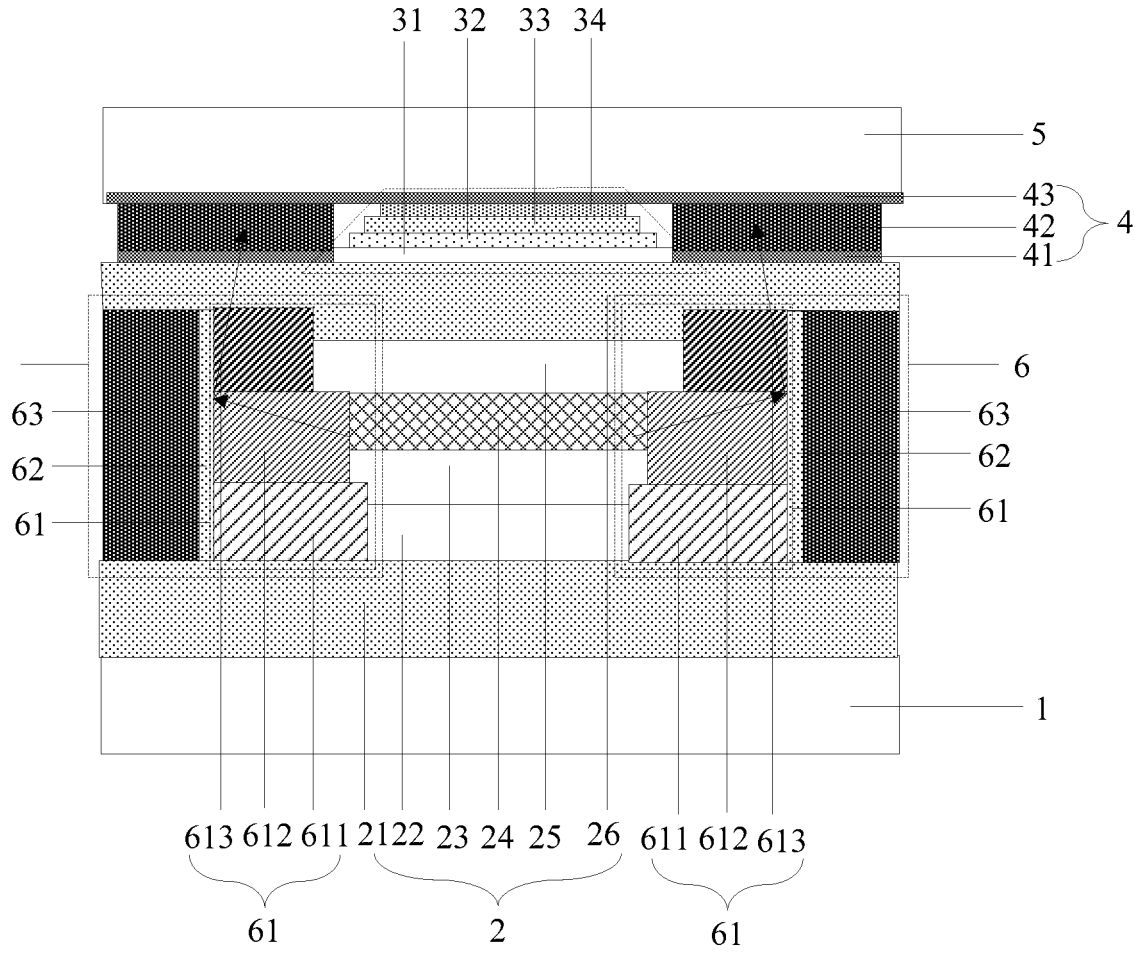
FIG. 7 is a seventh sectional view of a display panel provided in embodiments of the disclosure.

In a possible implementation, in conjunction with FIGS. 1 to 6, the display panel further includes dam structures 6 for spacing different light-emitting devices; and referring to FIG. 7, each dam structure 6 includes a first dam structure 63 surrounding the light-emitting device 2.

Figure 8:
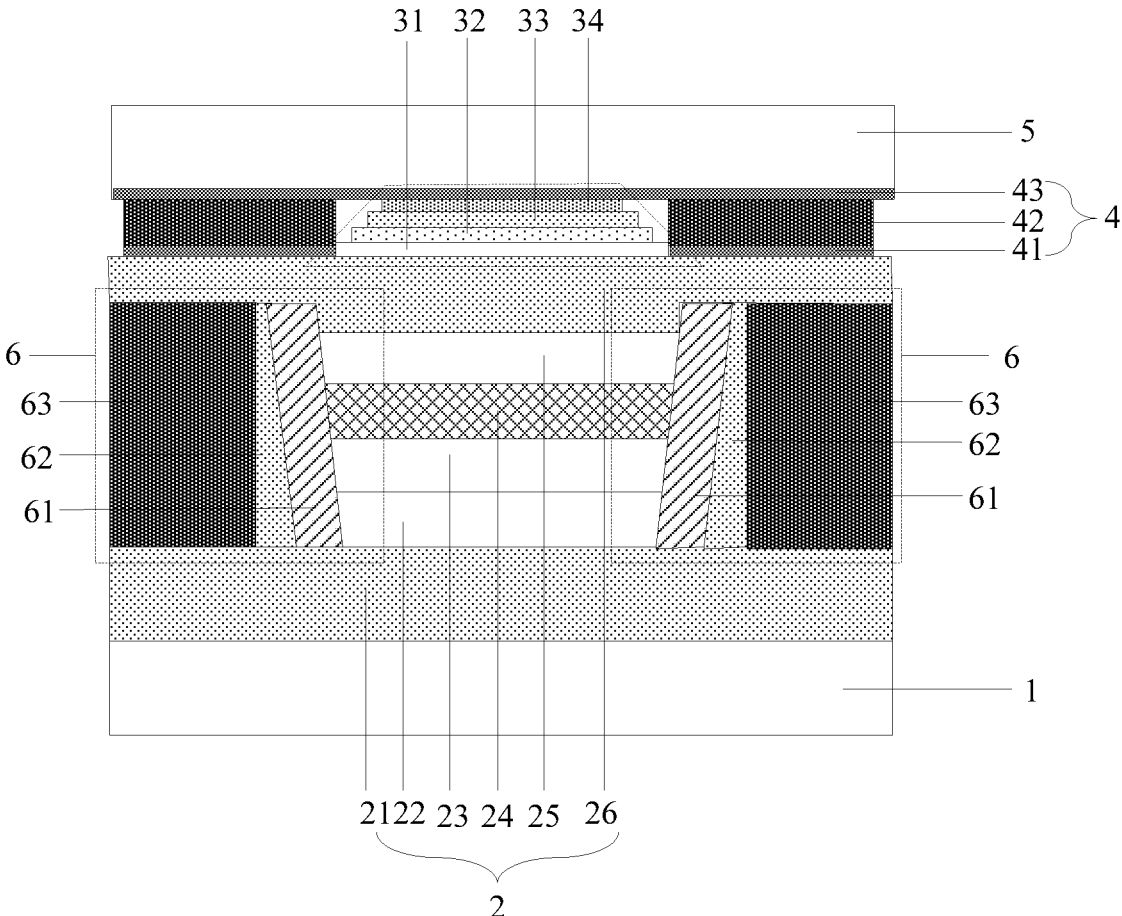
FIG. 8 is an eighth sectional view of a display panel provided in embodiments of the disclosure.

In a possible implementation, in conjunction with FIG. 7 or 8, the first dam structure 63 is a shading structure in a single film layer.

At present, there are mainly several solutions for transparent display, such as transparent organic light-emitting display, and transparent liquid crystal display. Transparent liquid crystal display achieves transparent display by light modulating characteristics of the liquid crystal display itself, but cannot do without backlight, and thus is currently mainly used in scenarios where a backlight source can be provided such as vending machines, but cannot be applied to automobiles or high-speed rails, etc. Transparent organic light-emitting display achieves high transmittance mainly by providing a light-transmitting area on a back plate, and its application scenarios are broader due to the advantages of self-illumination. However, since the transmittance of the light-transmitting area is fixed, the transparency cannot be changed, and thus the picture quality is affected by light. Therefore, embodiments of the disclosure also propose a novel display panel that combines quantum dot light-emitting pixels and electrochromic pixels to achieve active quantum dot light-emitting display with adjustable transparency. That is, in a possible implementation, in conjunction with FIG. 9, the first dam structure 63 is an electrochromic pixel structure, which is configured to switch between a transparent state and a display state depending on a voltage or current drive. In embodiments of the disclosure, the first dam structure 63 is an electrochromic pixel structure, which allows the transparency of the display panel to be adjustable according to the transparency requirement of the display panel.

Figure 9:
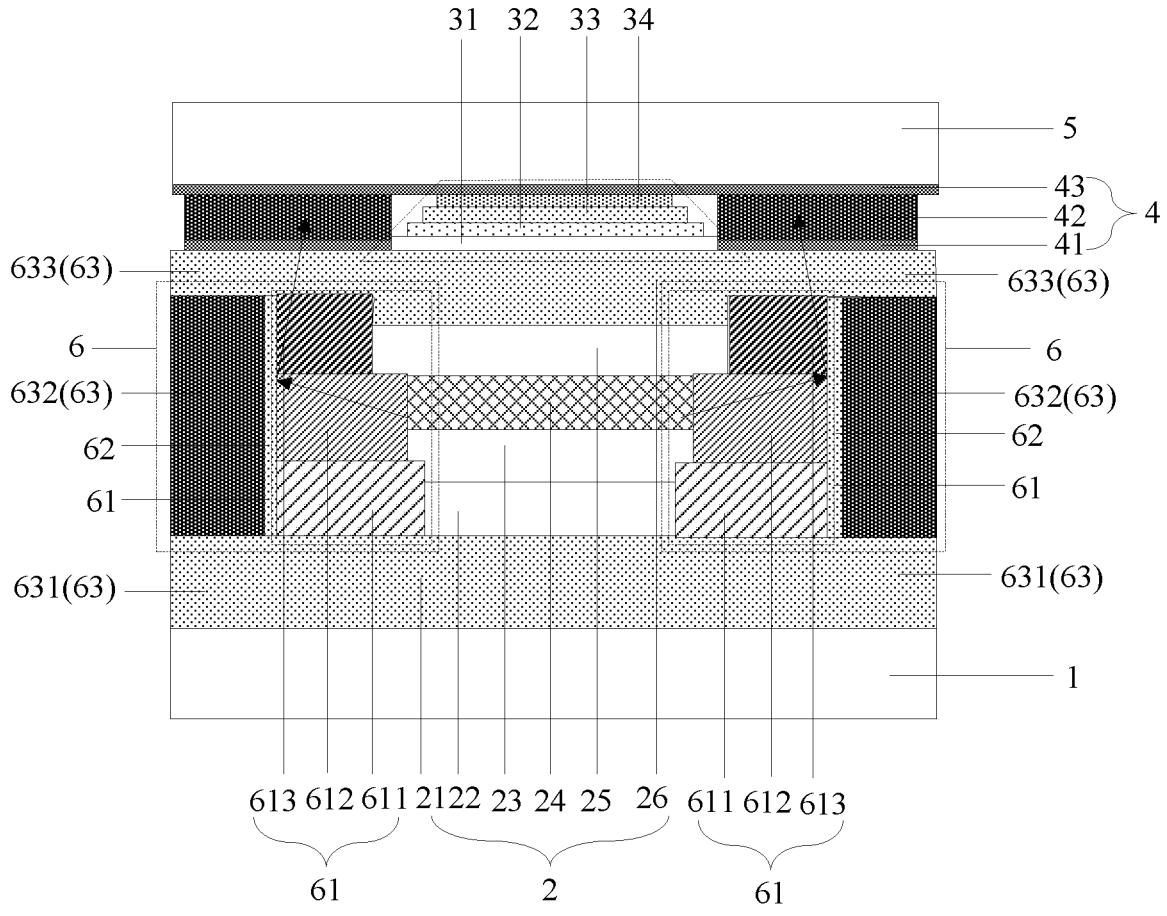
FIG. 9 is a ninth sectional view of a display panel provided in embodiments of the disclosure.

Specifically, in conjunction with FIG. 9, the electrochromic pixel structure includes: a first electrode 631, an electrochromic pixel layer 632 on a side of the first electrode 631 away from the base substrate 1, and a second electrode 633 on a side of the electrochromic pixel layer 632 away from the first electrode 631.

In a possible implementation, the first electrode 631 is also used as the first light-emitting electrode 21, and/or the second electrode 633 is also used as the second light-emitting electrode 26. Specifically, it is possible that only the first electrode 631 is used as the first light-emitting electrode 21; it is also possible that only the second electrode 633 is used as the second light-emitting electrode 26; and it is also possible that not only is the first electrode 631 used as the first light-emitting electrode 21, but also the second electrode 633 is used as the second light-emitting electrode 26. Of course, in specific implementation, it is also possible to prepare a separate first electrode 631 and a separate second electrode 633 for the electrochromic pixel structure.

In a possible implementation, the material of the electrochromic pixel layer 632 can include: tungsten trioxide, molybdenum trioxide, polythiophenes and derivatives thereof, viologens, tetrathiafulvalenes, or metal phthalocyanine compounds.

In a possible implementation, in conjunction with FIG. 7 or 8, the dam structure 6 further includes a second dam structure 62. The second dam structure 62 is disposed on a side of the first dam structure 63 facing the light-emitting device 2, and the second dam structure 62 is configured to reflect light emitted by the light-emitting device 2 directing to the second dam structure 62, to the light extraction structure 3.

In a possible implementation, the second dam structure 62 includes: a reflective metal film or a metal dielectric reflective film.

Specifically, the material of the reflective metal film can include silver or aluminum.

Specifically, the metal dielectric reflective film includes a base film, and at least one dielectric layer on a side of the base film facing the light-emitting device; and the material of the base film includes: silicon monoxide, magnesium fluoride, silicon dioxide or aluminum trioxide. The metal dielectric reflective film is based on multi-beam interference. In contrast to an anti-reflection film, the reflectivity of an optical surface can be increased by plating, on the optical surface, a thin film with a higher refractive index than the material of the base film. The simplest multiple dielectric layers are formed by alternate evaporation of two materials, one with a high refractive index and the other with a low refractive index.

In a possible implementation, in conjunction with FIG. 7, the dam structure 6 further includes a third dam structure 61 located on a side of the second dam structure 62 facing the light-emitting device 2, and in a direction from the base substrate 1 to the light-emitting device 2, an opening formed by enclosure of the third dam structure 61 in a direction parallel to the base substrate 1 increases progressively. In embodiments of the disclosure, the opening formed by enclosure of the third dam structure 61 in the direction parallel to the base substrate 1 progressively increasing can facilitate light extraction of the light emergent from the light-emitting device 2.

In a possible implementation, in conjunction with FIG. 7, the third dam structure 61 includes a plurality of light guide film layers which are stacked successively. Specifically, for example, the third dam structure 61 includes a first sub-light guide film layer 611, a second sub-light guide film layer 612 and a third sub-light guide film layer 613 located successively on a side of the base substrate 1. In the direction from the base substrate 1 to the light-emitting device 2, the refractive indices of the light guide film layers increase progressively. That is, the refractive index of the first sub-light guide film layer 611 is less than that of the second sub-light guide film layer 612, and the refractive index of the second sub-light guide film layer 612 is less than that of the third sub-light guide film layer 613. In embodiments of the disclosure, the refractive indices of the light guide film layers increasing progressively can further facilitate light extraction of the light emergent from the light-emitting device 2.

Specifically, the refractive index n1 of the first sub-light guide film layer 611, the refractive index n2 of the second sub-light guide film layer 612, and the refractive index n3 of the third sub-light guide film layer 613 can satisfy $n1 < n2 < n3$, where $1.4 < n1 < 1.5$; $1 < n2 < 1.6$; and $n2 < n3 < 1.8$.

In a possible implementation, each light guide film layer includes a second body, and a second dopant mixed in the second body; the refractive index of the second dopant is higher than that of the second body; and in the direction from the base substrate 1 to the light-emitting device 2, the proportion of the second dopant content in each light guide film layer increases progressively. In specific implementation, the amounts of the second body (e.g., silicon oxide) and the second dopant (e.g., boron nitride) can be controlled by chemical vapor deposition of the second body and the second dopant to achieve a higher content of boron nitride doped in an upper layer, which can induce light to be extracted from the inside of the light-emitting device 2.

In a possible implementation, in conjunction with FIG. 7, in the direction pointed from the base substrate 1 to the light-emitting device 2, the cross-sectional areas of cross sections of the light guide film layers in parallel with the base substrate 1 decrease progressively. Specifically, the widths of the light guide film layers in the same direction parallel to the base substrate 1 decrease progressively. Specifically, 0.3 μm>the width of the first sub-light guide film layer 611>the width of the second sub-light guide film layer 612>the width of the third sub-light guide film layer 613>0.1 μm.

In a possible implementation, in conjunction with FIG. 7, the thicknesses of the light guide film layers in the direction perpendicular to the base substrate are roughly the same. Specifically, the thicknesses of the light guide film layers are 0.3 μm to 0.5 μm.

In a possible implementation, in conjunction with FIG. 8, the third dam structure 61 is an inclined one-piece slope structure. In embodiments of the disclosure, the third dam structure 61 being an inclined one-piece slope structure can also facilitate light extraction of the light emergent from the light-emitting device 2.

Figure 10:
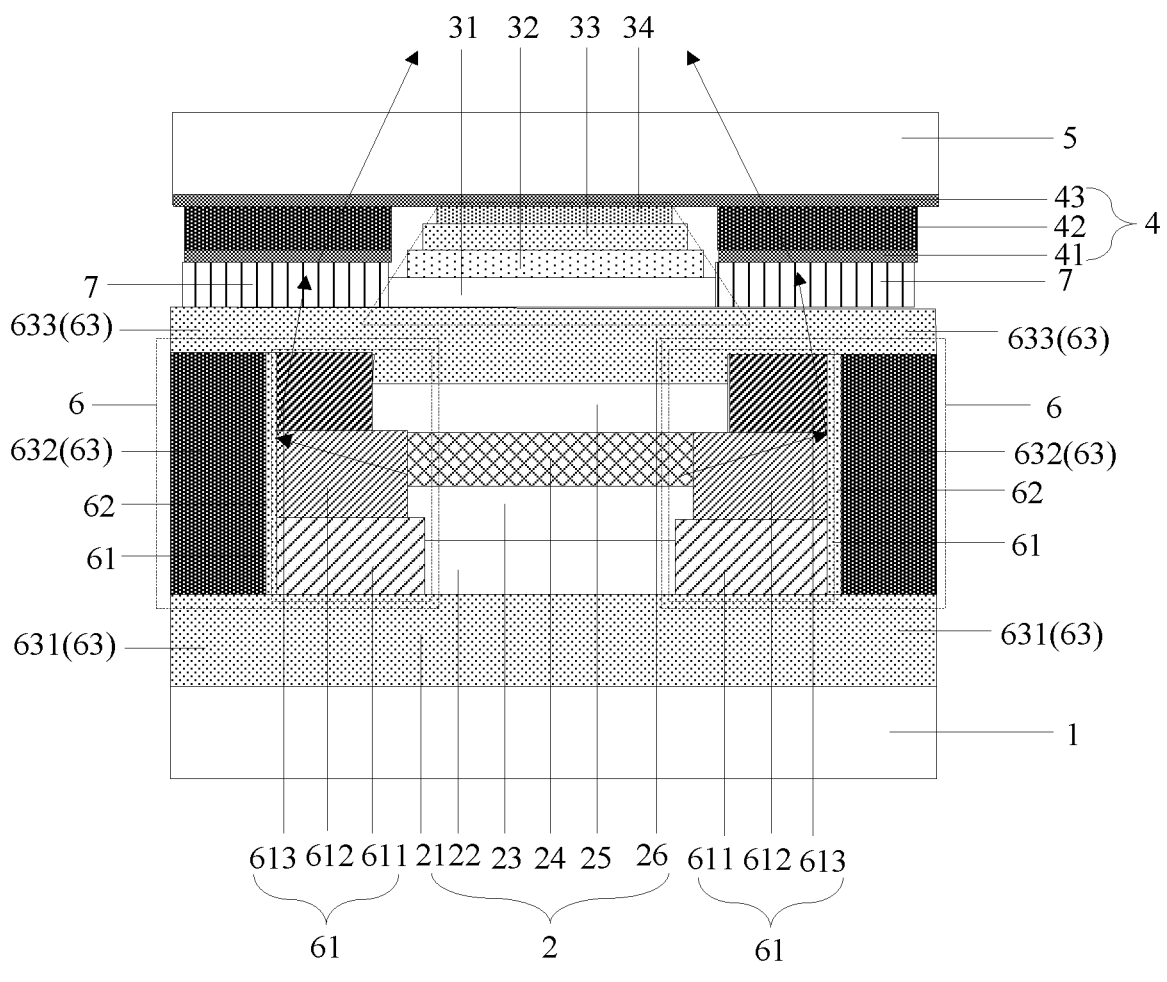
FIG. 10 is a tenth sectional view of a display panel provided in embodiments of the disclosure.
Figure 11:
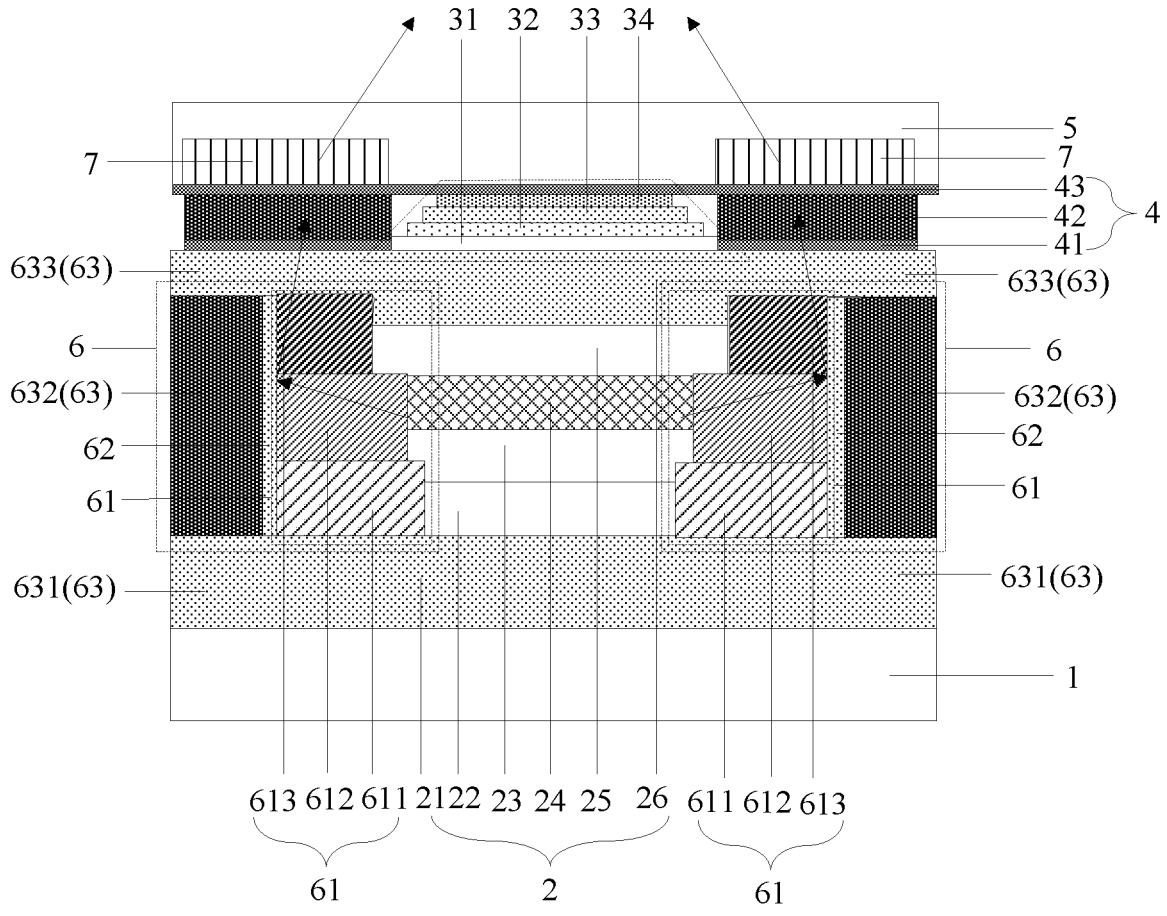
FIG. 11 is an eleventh sectional view of a display panel provided in embodiments of the disclosure.

In a possible implementation, referring to FIG. 10 or 11, the display panel further includes a light guide layer 7 located at an edge of the light-emitting device 2. The light guide layer 7 is located between the light-emitting device 2 and the electrochromic structure 3, as shown in FIG. 10; or the light guide layer 7 is located on a side of the electrochromic structure 3 away from the light-emitting device 2, as shown in FIG. 11. In embodiments of the disclosure, the display panel further including a light guide layer 7 located at an edge of the light-emitting device 2 can effectively export photons generated inside the light-emitting device 2 after power is on to improve the light extraction efficiency, and this structure can reduce a voltage drop of a large-size panel to some extent.

In a possible implementation, the material of the light guide layer 7 can include: ethylene-vinyl acetate, a TP-THPE copolymeric epoxy, or an epoxy and episulfide resin polymer. Specifically, the light guide layer 7 can be prepared by inkjet printing, and the light guide layer 7 can be a transparent adhesive material with a high refractive index. The adhesive material can be an organic adhesive material such as ethylene-vinyl acetate. The material of the light guide layer 7 can also be a TP-THPE copolymeric epoxy, which specifically can be synthesized by THPE, sulfur-containing monomer dihydroxydiphenyl sulfide (TP) and ECH as raw materials. The material of the light guide layer 7 can also be an epoxy and episulfide resin polymer with a high sulfur content and a high refractive index (refractive index range: 1.65 to 1.75), which can be obtained by ring-opening polymerization of epoxy and episulfide resin monomers and an equimolar 4,4-dimercaptodiphenyl sulfide (TDBT) curing agent.

Based on the same inventive concept, embodiments of the disclosure further provide a display device, which includes the display panel provided in embodiments of the disclosure.

Figure 12:
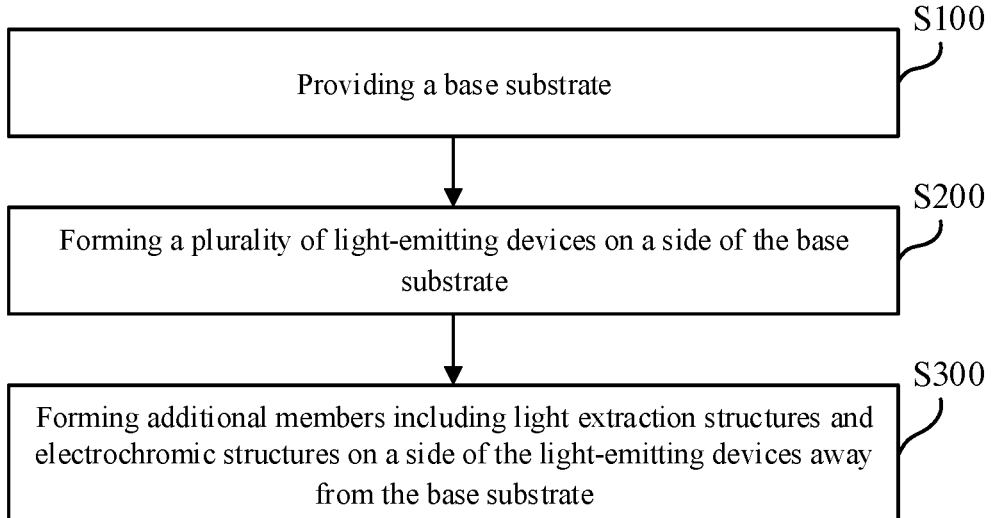
FIG. 12 is a schematic diagram of a fabricating process of a display panel provided in embodiments of the disclosure.

Based on the same inventive concept, referring to FIG. 12, embodiments of the disclosure further provide a fabricating method of a display panel provided in embodiments of the disclosure, including:

S100, providing a base substrate;

S200, forming a plurality of light-emitting devices on a side of the base substrate; and S300, forming additional members including light extraction structures and electrochromic structures on a side of the light-emitting devices away from the base substrate, where orthographic projections of the light extraction structures on the base substrate overlap orthographic projections of the light-emitting devices on the base substrate, and orthographic projections of the electrochromic structures on the base substrate are located between orthographic projections of adjacent light-emitting devices on the base substrate.

In a possible implementation, each light extraction structure includes a plurality of light extraction film layers which are stacked successively; accordingly, in S300, forming light extraction structures on a side of the light-emitting devices away from the base substrate can include:

forming a plurality of light extraction film layers by multiple evaporation steps, and controlling the area of an orthographic projection of a light extraction film layer formed by a subsequent evaporation step after a current evaporation step on the base substrate to be smaller than the area of an orthographic projection of a light extraction film layer formed by a current evaporation step on the base substrate.

Specifically, forming a plurality of light extraction film layers by multiple evaporation steps can include:

in areas where the light-emitting devices are located, forming a plurality of light extraction film layers, each including a first body and a first dopant, by multiple evaporation steps, and controlling the proportion of the first dopant in the light extraction film layer formed by the subsequent evaporation step to be greater than the proportion of the first dopant in the light extraction film layer formed by the current evaporation step.

In a possible implementation, each light extraction structure includes a lens structure with a circular dome; accordingly, in S300, forming additional members on a side of the light-emitting devices away from the base substrate can include:

printing a second ink via a first inkjet printing process in areas where the light-emitting devices are located; and irradiating the second ink by ultraviolet light to form the lens structure.

Specifically, the light extraction structure further includes a planarization structure located between the light-emitting device and the lens structure; and before printing a photo-curable ink by a first inkjet printing process, forming additional members on a side of the light-emitting devices away from the base substrate further includes:

printing a first ink via a second inkjet printing process; and drying the first ink by a drying device to volatilize a solvent in the first ink to form the planarization structure, a surface of which facing away from the light-emitting device is flat.

In a possible implementation, in S300, forming electrochromic structures on a side of the light-emitting devices away from the base substrate includes:

forming a first electrode, an electrochromic layer, and a second electrode successively in areas where adjacent light-emitting devices are located on a side of the light-emitting devices away from the base substrate.

To more clearly understand the fabricating method of the display panel provided in embodiments of the disclosure, further illustrations are provided below by examples.

Embodiment 1

In conjunction with FIG. 4, light-emitting devices 2, electrochromic structures 4, and light extraction structures 3 can be fabricated successively on an array substrate. Specifically, a fabricating method of a display panel can include the following steps.

1. An array substrate including dam structures 6 is prepared.

2. A plurality of film layers of light-emitting devices 2 are prepared in pixel areas defined by the dam structures 6. The specific process can be preparing, by an evaporation or inkjet printing apparatus, a hole injection layer/a hole transport layer/a quantum dot light-emitting layer/ an electron transport layer, respectively.

3. A second light-emitting electrode is evaporated by using an open mask.

4. Film layers in electrochromic structures are deposited by using a fine metal mask (FMM MASK).

5. Light extraction structures 3 including a plurality of light extraction film layers are prepared.

5.1. A plurality of light extraction film layers can be prepared by evaporation. Using a FMM mask, light extraction film layers with different refractive indices are evaporated to achieve a condensing effect. Different light extraction film layers can by prepared by using different FMM masks, and their preparation areas decrease progressively.

The thicknesses of the first sub-light extraction film layer 31, the second sub-light extraction film layer 32, the third sub-light extraction film layer 33, and the fourth sub-light extraction film layer 34 are in the range of 0.4 um to 0.6 um. The lengths and widths of the first sub-light extraction film layer 31, the second sub-light extraction film layer 32, the third sub-light extraction film layer 33, and the fourth sub-light extraction film layer 34 in two perpendicular directions on a plane parallel to the base substrate 1 can be correlated with size dimensions of the corresponding light-emitting device 2. If the light-emitting device 2 has a length of X µm and a width of Y µm, the lengths and widths of the first sub-light extraction film layer 31, the second sub-light extraction film layer 32, the third sub-light extraction layer 33, and the fourth sub-light extraction layer 34 can be ((X+5)µm to (X+10)µm, (Y+5)µm to (Y+10)µm), ((X+4)µm to (X+9)µm, (Y+4)µm to Y+9 µm), ((X+3)µm to (X+8)µm, (Y+3)µm to (Y+8)µm), ((X+2)µm to (X+7)µm, (Y+2)µm to (Y+7)µm), respectively.

The light extraction film layers can be prepared by chemical vapor deposition of boron nitride and silicon oxide of different contents, and the amounts of boron nitride and silicon oxide are controlled to achieve a higher content of boron nitride doped in an upper layer, such that the refractive index in the upper layer is higher than that in a lower layer. The material of the light extraction film layers can also be an inorganic material with a high refractive index such as titanium dioxide ($TiO_2$), zirconium dioxide ($ZrO_2$), lead sulfide (PbS) or zinc sulfide (ZnS), which is doped, at the nanoscale, with an organic or polymeric substrate, and the ratio between the inorganic and organic materials is adjusted to prepare the light extraction film layers, refractive indices of which are in the range of 1.4 to 2.

At gaps between the light extraction structures 3 are electrochromic structures 4, and the width of an electrochromic layer 42 in each electrochromic structure 4 can be 5 um to 25 um.

5.2. The light extraction structures 3 can be prepared by printing. A transparent second ink, which can be photocurable ink, is printed to form a circular dome structure, which functions to condense light after curing.

The first ink and the second ink can be fully aromatic polyimides, or polymers with aromatic rings as a basic backbone doped with 2 methoxyethanol or alkanes (tridecane to hexadecane), and the resulting first and second inks have a viscosity of 5 to 12 cp and a surface tension of 22 to 35 mN/m.

Printing parameters can be set to print a photocurable ink between the electrochromic structure 4. The size of an ink droplet can be adjusted to 3.5 pl to 5 pl, and the number of printing droplets can be set to 1 to 10. Ink printing can be carried out twice. The first ink is printed first, with the number of droplets of the first ink being set to 1 to 3, and the first ink can be dried by using VCD or other to obtain a relatively flat film, and then the second ink is printed, which is a photocurable ink, the number of printing droplets of which is set to 1 to 10, and after printing is completed, irradiation with UV light is carried out for 500 ms to 40 s so that the ink is cured to form a convex lens structure. It is also possible to directly print the second ink to form a convex lens. The thickness of the first ink is 0.1 um to 0.1 um, and the thickness of the second ink is 0.7 to 2 um.

A main function of the first ink is to enable a contact angle with the base to be small. It facilitates spreading of the second ink. The refractive index of the first ink is less than that of the ink 2. The refractive index of the first ink is 1.4 to 1.6, and the refractive index of the second ink is 1.6 to 2.

6. A second electrode 43 of the electrochromic structure is prepared by using an FMM mask.

Embodiment 2

In conjunction with FIG. 6, light-emitting devices 2 can be fabricated successively on an array substrate, and electrochromic structures 4 and light extraction structures 3 can be prepared on a packaging cover plate. Specifically, a fabricating method of a display panel can include the following steps.

1. An array substrate including dam structures 6 is prepared.

2. A plurality of film layers of light-emitting devices 2 are prepared in pixel areas defined by the dam structures 6. The specific process can be preparing, by an evaporation or inkjet printing apparatus, a hole injection layer/a hole transport layer/a quantum dot light-emitting layer/ an electron transport layer, respectively.

3. A second light-emitting electrode is evaporated by using an open mask.

4. Light extraction structures 3 including a plurality of light extraction film layers are prepared in areas on a packaging cover plate corresponding to the dam structures 6.

4.1. A plurality of light extraction film layers can be prepared by evaporation. Using a FMM mask, light extraction film layers with different refractive indices are evaporated to achieve a condensing effect. Different light extraction film layers can by prepared by using different FMM masks, and their preparation areas decrease progressively.

The thicknesses of the first sub-light extraction film layer 31, the second sub-light extraction film layer 32, the third sub-light extraction film layer 33, and the fourth sub-light extraction film layer 34 are in the range of 0.4 um to 0.6 um. The lengths and widths of the first sub-light extraction film layer 31, the second sub-light extraction film layer 32, the third sub-light extraction film layer 33, and the fourth sub-light extraction film layer 34 in two perpendicular directions on a plane parallel to the base substrate 1 can be correlated with size dimensions of the corresponding light-emitting device 2. If the light-emitting device 2 has a length of X μm and a width of Y μm, the lengths and widths of the first sub-light extraction film layer 31, the second sub-light extraction film layer 32, the third sub-light extraction layer 33, and the fourth sub-light extraction layer 34 can be ((X+5)μm to (X+10)μm, (Y+5)μm to (Y+10)μm), ((X+4)μm to (X+9)μm, (Y+4)μm to Y+9 μm), ((X+3)μm to (X+8)μm, (Y+3)μm to (Y+8)μm), ((X+2)μm to (X+7)μm, (Y+2)μm to (Y+7)μm), respectively.

The light extraction film layers can be prepared by chemical vapor deposition of boron nitride and silicon oxide of different contents, and the amounts of boron nitride and silicon oxide are controlled to achieve a higher content of boron nitride doped in an upper layer, such that the refractive index in the upper layer is higher than that in a lower layer. The material of the light extraction film layers can also be an inorganic material with a high refractive index such as titanium dioxide (TiO2), zirconium dioxide (ZrO2), lead sulfide (PbS) or zinc sulfide (ZnS), which is doped at the nanoscale on an organic or polymeric substrate, and the ratio between the inorganic and organic materials is adjusted to obtain the light extraction film layers, refractive indices of which are in the range of 1.4 to 2.

At gaps between the light extraction structures 3 are electrochromic structures 4, and the width of an electrochromic layer 42 in each electrochromic structure 4 can be 5 um to 25 um.

4.2. The light extraction structures 3 can be prepared by printing. A transparent second ink, which can be photocurable ink, is printed to form a circular dome structure, which functions to condense light after curing.

The first ink and the second ink can be fully aromatic polyimides, or polymers with aromatic rings as a basic backbone doped with 2 methoxyethanol or alkanes (tridecane to hexadecane), and the resulting first and second inks have a viscosity of 5 to 12 cp and a surface tension of 22 to 35 mN/m.

Printing parameters can be set to print a photocurable ink between the electrochromic structure 4. The size of an ink droplet can be adjusted to 3.5 pl to 5 pl, and the number of printing droplets can be set to 2 to 10. Ink printing can be carried out twice. The first ink is printed first, with the number of droplets of the first ink being set to 1 to 3, and the first ink can be dried by using VCD or other to obtain a relatively flat film, and then the second ink is printed, which is a photocurable ink, the number of printing droplets of which is set to 2 to 10, and after printing is completed, irradiation with UV light is carried out for is to 40 s so that the ink is cured to form a convex lens structure. It is also possible to directly print the second ink to form a convex lens. The thickness of the first ink is 0.01 um to 0.1 um, and the thickness of the second ink is 0.7 to 2 um.

A main function of the first ink is to enable a contact angle with the base to be small. It facilitates spreading of the second ink. The refractive index of the first ink is less than that of the ink 2. The refractive index of the first ink is 1.4 to 1.6, and the refractive index of the second ink is 1.6 to 2.

5. Using a glass packaging cover plate, film layers of the electrochromic structures are prepared on the packaging cover plate. The electrochromic structures 4 fabricated on the packaging cover plate can be prepared by the following method.

5.1. A second electrode 43 is prepared on a whole surface of the glass packaging cover plate. The second electrode 43 is a transparent material and can be a Mg:Ag electrode (3 nm to 10 nm) or a thin Al electrode (3 nm to 10 nm).

5.2. An electrochromic layer is prepared by evaporation using an FMM mask, or a patterned electrochromic layer is prepared by an exposure development method.

5.3. A patterned first electrode 41 is prepared by using a FMM MASK.

Embodiment 3

In conjunction with FIG. 7 or 10, a third dam structure 61 including a plurality of light guide film layers that can be formed, and a fabricating method of a display panel can include the following steps.

The material of a quantum dot light-emitting layer can be CdSe/ZnS quantum dots (which can be formed by inkjet printing; the concentration of a quantum dot ink can be specifically 15 mg/ml, and a solvent can be octane); the material of a hole injection layer can be PEDOT; the material of a hole transport layer can be TFB (with a chlorobenzene solvent, 10 mg/ml); and the material of the electron transport layer can be zinc oxide nanoparticles (30 mg/ml, with an ethanol solvent).

A preparing method of a dam structure 6 can include the following steps.

A black first dam structure 63 is prepared on an array substrate by using an exposure development method.

A reflective second dam structure 62 is deposited on the array substrate, and after deposition is completed, exposure development is performed for patterning.

Boron nitride and silicon oxide are deposited at the same time on the second dam structure 62 by chemical vapor deposition, with a deposited film thickness of 300 nm. Boron nitride and silicon oxide in the first 150 nm film layer are in a mass ratio of 1:9, and boron nitride and silicon oxide in the last 150 nm film layer are in a mass ratio of 3:7. After deposition is completed, a photoresist is spin coated, exposure development is performed to form a pattern, and dry etching is performed on silicon oxide and boron nitride in areas where deposition of light guide banks are not needed. After etching is completed, the excess photoresist is stripped off, to form a third dam structure 61 where the substrate needs to guide light.

Preparation of a quantum dot light-emitting device includes the following.

(1) PEDOT is deposited on a first light-emitting electrode 21 as a hole injection layer 22. Specific process parameters can be: spin coating at 4000 rpm for 30 s, and annealing at 200 degrees for 5 minutes.

(2) TFB is spin coated as a hole transport layer 23. Specific process parameters can be: spin coating at 3000 rpm for 30 s, and annealing at 180 degrees for 15 minutes.

(3) A quantum dot film layer is spin coated. Specific process parameters can be: spin coating at 2500 rpm for 30 s, and annealing at 120 degrees for 20 minutes.

(4) A zinc oxide film layer is spin coated as an electron transport layer 25. Specific process parameters can be: spin coating at 2500 rpm for 30 s, and annealing at 120 degrees for 20 minutes.

(5) A cathode is vacuum evaporated as a second light-emitting electrode 26, and packaging is performed by a chemical vapor process. After packaging is completed, a light guide layer 7 is prepared by using an inkjet printing apparatus, UV curing is carried out and then packaging is performed by using packaging glass.

Embodiment 4

In conjunction with FIG. 8, a third dam structure 61 can be prepared using an inverted trapezoidal structure, and a second dam structure 62 at a reflective surface is an inclined surface, thereby increasing light extraction.

The material of a quantum dot light-emitting layer can be CdSe/ZnS quantum dots (which can be formed by inkjet printing; the concentration of a quantum dot ink can be specifically 15 mg/ml, and a solvent can be octane); the material of a hole injection layer can be PEDOT; the material of a hole transport layer can be TFB (with a chlorobenzene solvent, 10 mg/ml); and the material of the electron transport layer can be zinc oxide nanoparticles (30 mg/ml, with an ethanol solvent).

A preparing method of a dam structure 6 can include the following steps.

A black first dam structure 63 is prepared on an array substrate by using an exposure development method.

A reflective second dam structure 62 is deposited on the array substrate, and after deposition is completed, exposure development is performed for patterning to form a second dam structure 62 with an inclined surface.

Light guide material modification is performed on the second dam structure 62. A light guide material is spin coated, and exposure development is performed to form a final third dam structure.

Preparation of an QLED device includes the following.

(1) PEDOT is deposited on a first light-emitting electrode 21 as a hole injection layer 22. Specific process parameters can be: spin coating at 4000 rpm for 30 s, and annealing at 200 degrees for 5 minutes.

(2) TFB is spin coated as a hole transport layer 23. Specific process parameters can be: spin coating at 3000 rpm for 30 s, and annealing at 180 degrees for 15 minutes.

(3) A quantum dot film layer is spin coated. Specific process parameters can be: spin coating at 2500 rpm for 30 s, and annealing at 120 degrees for 20 minutes.

(4) A zinc oxide film layer is spin coated as an electron transport layer 25. Specific process parameters can be: spin coating at 2500 rpm for 30 s, and annealing at 120 degrees for 20 minutes.

(5) A cathode is vacuum evaporated as a second light-emitting electrode 26, and packaging is performed by a chemical vapor process. After packaging is completed, a light guide layer 7 is prepared by using an inkjet printing apparatus, UV curing is carried out and then packaging is performed by using packaging glass.

Preferred embodiments of the present invention are described above; however, additional variations and modifications can be made to these embodiments by those skilled in the art once they learn basic creative concepts. Therefore, the appended claims are intended to be interpreted as including the preferred embodiments and all variations and modifications falling within the scope of the present invention.

Evidently, those skilled in the art can make changes and modifications to the embodiments of the present invention without departing from the spirit and scope of the present invention. Thus, the present invention is also intended to encompass these modifications and variations to the embodiments of the present invention so long as the modifications and variations come into the scope of the claims appended to the present invention and their equivalents.

What is claimed is:

1. A display panel, comprising:

a base substrate;

a plurality of light-emitting devices, disposed on a side of the base substrate;

additional members on a side of the light-emitting devices away from the base substrate, the additional members comprising light extraction structures and electrochromic structures, wherein orthographic projections of the light extraction structures on the base substrate overlap orthographic projections of the light-emitting devices on the base substrate, and the light extraction structures are configured to draw in light emergent from the light-emitting devices; and orthographic projections of the electrochromic structures on the base substrate are located between orthographic projections of adjacent light-emitting devices on the base substrate, and the electrochromic structures are configured to be in a transparent state when the light-emitting devices emit light, and to be in a shading state when the light-emitting devices do not emit light; and dam structures for spacing different light-emitting devices; wherein the dam structure comprises: a first dam structure surrounding the light-emitting device, a second dam structure located on a side of the first dam structure facing the light-emitting device, and a third dam structure on a side of the second dam structure facing the light-emitting device; the second dam structure is configured to reflect light emitted by the light-emitting device directing to the second dam structure to the light extraction structure, and in a direction from the base substrate to the light-emitting device, an opening formed by enclosure of the third dam structure in a direction parallel to the base substrate increases progressively.

2. The display panel according to claim 1, wherein the orthographic projections of the light extraction structures on the base substrate cover the orthographic projections of the light-emitting devices on the base substrate among the orthographic projections of the light-emitting devices on the base substrate and the orthographic projections of the electrochromic structures on the base substrate;

or the orthographic projections of the light extraction structures on the base substrate cover the orthographic projections of the light-emitting devices on the base substrate and cover the orthographic projections of the electrochromic structures on the base substrate; and in areas where the orthographic projections of the light extraction structures overlap the orthographic projections of the electrochromic structures, the electrochromic structures are disposed on a side of the light extraction structures facing the base substrate.

3. The display panel according to claim 2, wherein a proportion of an orthographic projection area of the light extraction structure on the base substrate to an orthographic projection area of the electrochromic structure on the base substrate ranges from 0.7 to 1.6.

4. The display panel according to claim 1, wherein the electrochromic structure comprises:

a first electrode;

an electrochromic layer on a side of the first electrode away from the base substrate; and a second electrode on a side of the electrochromic layer away from the first electrode.

5. The display panel according to claim 4, wherein the material of the electrochromic layer comprises one or more of: tungsten trioxide, molybdenum trioxide, polythiophenes and derivatives thereof, viologens, tetrathiafulvalenes, or metal phthalocyanine compounds.

6. The display panel according to claim 1, wherein each light extraction structure comprises a plurality of light extraction film layers which are stacked successively, and a cross-sectional shape of each light extraction film layer in a direction perpendicular to the base substrate is rectangular.

7. The display panel according to claim 6, wherein refractive indices of the light extraction film layers increase successively in a direction from the light-emitting device to the light extraction structure.

8. The display panel according to claim 7, wherein the light extraction film layer comprises a first body, and a first dopant mixed in the first body; an refractive index of the first dopant is higher than an refractive index of the first body; and in the direction from the light-emitting device to the light extraction structure, a proportion of content of the first dopant in each light extraction film layer increases progressively.

9. The display panel according to claim 8, wherein a material of the first body comprises silicon oxide, and the material of the first dopant comprises boron nitride;

or the material of the first body comprises an organic matter or polymer, and the material of the first dopant comprises titanium dioxide, zirconium dioxide, lead sulfide, or zinc sulfide.

10. The display panel according to claim 6, wherein in the direction from the light-emitting device to the light extraction structure, cross-sectional areas of cross sections of the light extraction film layers in parallel with the base substrate decrease successively.

11. The display panel according to claim 1, wherein the light extraction structure comprises a lens structure with a circular dome.

12. The display panel according to claim 11, wherein the light extraction structure further comprises a planarization structure between the light-emitting device and the lens structure, and an refractive index of the planarization structure is less than an refractive index of the lens structure.

13. The display panel according to claim 1, wherein the first dam structure is a shading structure of one film layer.

14. The display panel according to claim 1, wherein the first dam structure comprises an electrochromic material, and the first dam structure is configured to switch between a transparent state and a non-transparent state depending on a voltage or current drive.

15. The display panel according to claim 14, wherein the first dam structure comprises a first electrode, a second electrode, and an electrochromic material layer between the comprises first electrode and the second electrode.

16. The display panel according to claim 15, wherein the light-emitting device comprises:

a first light-emitting electrode;

a light-emitting layer on a side of the first light-emitting electrode away from the base substrate; and a second light-emitting electrode on a side of the light-emitting layer away from the first light-emitting electrode;

wherein the first light-emitting electrode is used as the first electrode, and/or the second light-emitting electrode is used as the second electrode.

17. The display panel according to claim 1, wherein the second dam structure comprises: a reflective metal film or a metal dielectric reflective film.

18. The display panel according to claim 17, wherein a material of the reflective metal film comprises silver or aluminum;

the metal dielectric reflective film comprises a base film, and at least one dielectric layer on a side of the base film facing the light-emitting device; and a material of the base film comprises: silicon monoxide, magnesium fluoride, silicon dioxide or aluminum trioxide.

19. The display panel according to claim 1, wherein the third dam structure comprises a plurality of light guide film layers which are stacked successively; and in the direction from the base substrate to the light-emitting device, refractive indices of the light guide film layers increase progressively.

20. The display panel according to claim 19, wherein each light guide film layer comprises a second body, and a second dopant mixed in the second body; an refractive index of the second dopant is higher than an refractive index of the second body; and in the direction from the base substrate to the light-emitting device, a proportion of the second dopant content in each light guide film layer increases progressively.

21. The display panel according to claim 19, wherein in the direction from the base substrate to the light-emitting device, cross-sectional areas of cross sections of the light guide film layers in parallel with the base substrate decrease progressively.

22. A display device comprising the display panel of claim 1.

23. A fabricating method of the display panel of claim 1, comprising:

providing the base substrate;

forming the plurality of light-emitting devices on a side of the base substrate;

forming the additional members comprising light extraction structures and electrochromic structures on a side of the light-emitting devices away from the base substrate; and forming the dam structures.

24. The fabricating method according to claim 23, wherein the light extraction structure comprises a plurality of light extraction film layers which are stacked successively; and forming light extraction structures on a side of the light-emitting devices away from the base substrate comprises:

forming a plurality of light extraction film layers by multiple evaporation steps, and controlling an area of an orthographic projection of a light extraction film layer formed in a subsequent evaporation step after a current evaporation step on the base substrate to be smaller than an area of an orthographic projection of a light extraction film layer formed in the current evaporation step on the base substrate.

25. The fabricating method according to claim 24, wherein forming a plurality of light extraction film layers by multiple evaporation steps comprises:

in areas where the light-emitting devices are located, forming, by multiple evaporation steps, a plurality of light extraction film layers each comprising a first body and a first dopant, and controlling a proportion of the first dopant in the light extraction film layer formed in the subsequent evaporation step to be greater than a proportion of the first dopant in the light extraction film layer formed in the current evaporation step.

\* \* \* \* \*